United States Patent
Zhao et al.

(10) Patent No.: US 9,614,098 B2
(45) Date of Patent: Apr. 4, 2017

(54) THIN FILM TRANSISTOR AND MANUFACTURING METHOD THEREOF, ARRAY SUBSTRATE AND DISPLAY DEVICE

(71) Applicant: BOE TECHNOLOGY GROUP CO., LTD., Beijing (CN)

(72) Inventors: Ce Zhao, Beijing (CN); Chunsheng Jiang, Beijing (CN); Guangcai Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/435,688

(22) PCT Filed: Jun. 27, 2014

(86) PCT No.: PCT/CN2014/080910
§ 371 (c)(1),
(2) Date: Apr. 14, 2015

(87) PCT Pub. No.: WO2015/096436
PCT Pub. Date: Jul. 2, 2015

(65) Prior Publication Data
US 2016/0013317 A1    Jan. 14, 2016

(30) Foreign Application Priority Data

Dec. 24, 2013    (CN) .......................... 2013 1 0719312

(51) Int. Cl.
*H01L 21/00*    (2006.01)
*H01L 29/786*    (2006.01)
(Continued)

(52) U.S. Cl.
CPC .... *H01L 29/7869* (2013.01); *H01L 21/02565* (2013.01); *H01L 21/426* (2013.01);
(Continued)

(58) Field of Classification Search
CPC .............. H01L 29/24; H01L 29/66969; H01L 29/78606; H01L 29/78618; H01L 29/7869; H01L 21/02565; H01L 21/426
(Continued)

(56) References Cited

U.S. PATENT DOCUMENTS

2007/0072439 A1* 3/2007 Akimoto ............. H01L 27/1225
438/795
2009/0321731 A1* 12/2009 Jeong .................. H01L 29/4908
257/43

(Continued)

FOREIGN PATENT DOCUMENTS

CN    101621075 A    1/2010
CN    102709327 A    10/2012
(Continued)

OTHER PUBLICATIONS

Dec. 3, 2015—(CN)—First Office Action Appn 201310719312.3 with English Tran.

(Continued)

*Primary Examiner* — Victor A Mandala
*Assistant Examiner* — Colleen E Snow
(74) *Attorney, Agent, or Firm* — Banner & Witcoff, Ltd.

(57) ABSTRACT

A thin film transistor and a manufacturing method thereof, an array substrate and a display device are provided. The method includes forming a gate electrode, a gate insulating layer, a metal oxide semiconductor (MOS) active layer, a source electrode and a drain electrode on a substrate. The MOS active layer includes forming a pattern layer of indium oxide series binary metal oxide including a first, second, and third pattern directly contacting with the source electrode and the drain electrode. An insulating layer formed over the source electrode and the drain electrode acts as a protection layer, the pattern layer of indium oxide series binary metal (Continued)

oxide is implanted with metal doping ions by using an ion implanting process, and is annealed, so that the indium oxide series binary metal oxide of the third pattern is converted into the indium oxide series multiple metal oxide to form the MOS active layer.

7 Claims, 5 Drawing Sheets

(51) Int. Cl.
 *H01L 29/66* (2006.01)
 *H01L 21/02* (2006.01)
 *H01L 21/426* (2006.01)
 *H01L 29/24* (2006.01)
(52) U.S. Cl.
 CPC ........ *H01L 29/24* (2013.01); *H01L 29/66969* (2013.01); *H01L 29/78606* (2013.01); *H01L 29/78618* (2013.01)
(58) Field of Classification Search
 USPC ............................................ 257/43; 438/104
 See application file for complete search history.

(56) References Cited

U.S. PATENT DOCUMENTS

| | | | |
|---|---|---|---|
| 2010/0117074 A1 | 5/2010 | Yamazaki et al. | |
| 2011/0068349 A1* | 3/2011 | Shinohara | H01L 33/42 |
| | | | 257/76 |

FOREIGN PATENT DOCUMENTS

| | | |
|---|---|---|
| CN | 102867854 A | 1/2013 |
| CN | 103022149 A | 4/2013 |
| CN | 103378162 A | 10/2013 |
| CN | 103730346 A | 4/2014 |
| CN | 103730510 A | 4/2014 |
| WO | 2012091297 A1 | 7/2012 |

OTHER PUBLICATIONS

Sep. 30, 2014—(WO) International Search Report—PCT/CN2014/080910—Eng Tran.

Mar. 28, 2016—(CN)—Second Office Action Appn 201310719312.3 with English Tran.

* cited by examiner

THIN FILM TRANSISTOR AND MANUFACTURING METHOD THEREOF, ARRAY SUBSTRATE AND DISPLAY DEVICE

The application is a U.S. National Phase Entry of International Application No. PCT/CN2014/080910 filed on Jun. 27, 2014, designating the United States of America and claiming priority to Chinese Patent Application No. 201310719312.3 filed on Dec. 24, 2013. The present application claims priority to and the benefit of the above-identified applications and the above-identified applications are incorporated by reference herein in their entirety.

TECHNICAL FIELD

Embodiments of the present disclosure relate to a thin film transistor and a manufacturing method thereof, an array substrate and a display device.

BACKGROUND

With the increasing of a display size and the frequency of a drive circuit, the migration rate of the conventional amorphous silicon thin film transistors are hard to meet user's requirements.

A thin film transistor (TFT) with a high migration rate comprises a polycrystalline silicon TFT and a metal oxide TFT. In comparison, the polycrystalline silicon TFT has a poor homogeneity and a complex manufacturing process, and it is not good for mass production due to the limitation of laser crystallization equipment; however, the metal oxide TFT has advantages of high migration rate, good homogeneity, transparent and a simple manufacturing process, which can better meet the requirements of large size liquid crystal display (LCD), organic light-emitting-diode display (OLED) and polymer light-emitting-diode display (PLED), therefore, it gets wide attention.

Generally, for a thin film transistor (TFT), a certain energy barrier is produced on an interface surface between a source-drain electrode and a semiconductor active layer so as to form contact resistance; and the energy barrier can hinder the movement of the carrier. When the energy barrier is large at the interface and forms a Schottky contact, it will cause the loss of signal, thereby affect the performance of the TFT.

Furthermore, in the process of manufacturing the conventional metal oxide TFT, when the source-drain metal layer on the MOS active layer are etched in subsequent processes, it is possible to damage the MOS active layer, thereby to reduce the performance of the TFT. Therefore, an etching stop layer is provided over the MOS active layer to prevent the MOS active layer being damaged in the subsequent manufacturing processes. However, the addition of the etching stop layer will increase the complexity of the TFT manufacturing procedure and the cost. Therefore, it is important to simplify the manufacturing process without losing the performance of the TFT.

SUMMARY

The embodiments of the present disclosure provide a thin film transistor and a manufacturing method thereof, an array substrate and a display device.

At least one embodiment of the present disclosure provides a thin film transistor, and the thin film transistor comprises: a gate electrode; a gate insulating layer; a metal oxide semiconductor (MOS) active layer; a source electrode and a drain electrode provided on a substrate; wherein the MOS active layer is located between the substrate and the source and drain electrodes, and corresponds to a gap between the source electrode and the drain electrode; and a first pattern and a second pattern which contact with the MOS active layer and are located at a same layer with the MOS active layer; wherein the first pattern corresponds to the source electrode and directly contacts with the source electrode, and the second pattern corresponds to the drain electrode and directly contacts with the drain electrode.

The first pattern and the second pattern comprise indium oxide series binary metal oxide, the MOS active layer comprises indium oxide series multiple MOS, wherein the indium oxide series multiple metal oxide is obtained by implanting metal doping ions into the indium oxide series binary metal oxide and annealing it.

In an example, the thin film transistor is a bottom gate type; the thin film transistor further comprises a protection layer located over the source electrode and the drain electrode.

In an example, the thin film transistor is a top gate type.

In an example, the indium oxide series binary metal oxide comprises indium tin oxide (ITO), or indium gallium oxide (IGO), or indium zinc oxide (IZO).

In an example, the metal doping ions comprise at least one kind of zinc ions ($Zn^{2+}$), gallium ions ($Ga^{3+}$), tin ions ($Sn^{2+}$), aluminium ions ($Al^{3+}$) and hafnium ions ($Hf^{4+}$).

At least one embodiment of the present disclosure also provides an array substrate comprising the thin film transistor.

At least one embodiment of the present disclosure also provides a display device comprising the array substrate.

At least one embodiment of the present disclosure also provides a method of manufacturing the thin film transistor, and the method comprises forming a gate electrode, a gate insulating layer, a metal oxide semiconductor (MOS) active layer, a source electrode and a drain electrode on a substrate. The method further comprises forming a pattern layer of indium oxide series binary metal oxide. The pattern layer comprises a first pattern corresponding to the source electrode, a second pattern corresponding to the drain electrode and a third pattern corresponding to a gap between the source electrode and the drain electrode, and the pattern layer of the indium oxide series binary metal oxide directly contacts with the source electrode and the drain electrode. An insulating layer formed over the source electrode and the drain electrode acts as a barrier layer, the pattern layer of indium oxide series MOS is implanted with metal doping ions by using an ion implanting process, and is annealed, so that the indium oxide series binary metal oxide of the third pattern is converted into the indium oxide series multiple metal oxide to form the MOS active layer.

In an example, the thin film transistor is a bottom gate type.

In an example, the method further comprises forming a protection layer on the substrate on which the source electrode and the drain electrode are formed.

In an example, the method further comprises using the protection layer as a barrier layer, implanting metal doping ions into the pattern layer of indium oxide series binary metal oxide by using an ion implanting process, and annealing it, so as to convert the indium oxide series binary metal oxide of the third pattern which is not blocked by the source electrode and the drain electrode into the indium oxide series multiple MOS to form the MOS active layer.

In an example, the thin film transistor is a top gate type.

In an example, the method further comprises using the gate insulating layer as a barrier layer, implanting metal doping ions into the pattern layer of indium oxide series binary metal oxide by using an ion implanting process, and annealing it, so as to convert the indium oxide series binary metal oxide of the third pattern which is not blocked by the source electrode and the drain electrode into the indium oxide series multiple MOS to form the MOS active layer In an example, the indium oxide series binary metal oxide comprises ITO, or IGO, or IZO.

In an example, the metal doping ions comprises at least one kind of $Zn^{2+}$, $Ga^{3+}$, $Sn^{2+}$, $Al^{3+}$ and $Hf^{4+}$.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which.

DETAILED DESCRIPTION

Figure 1:
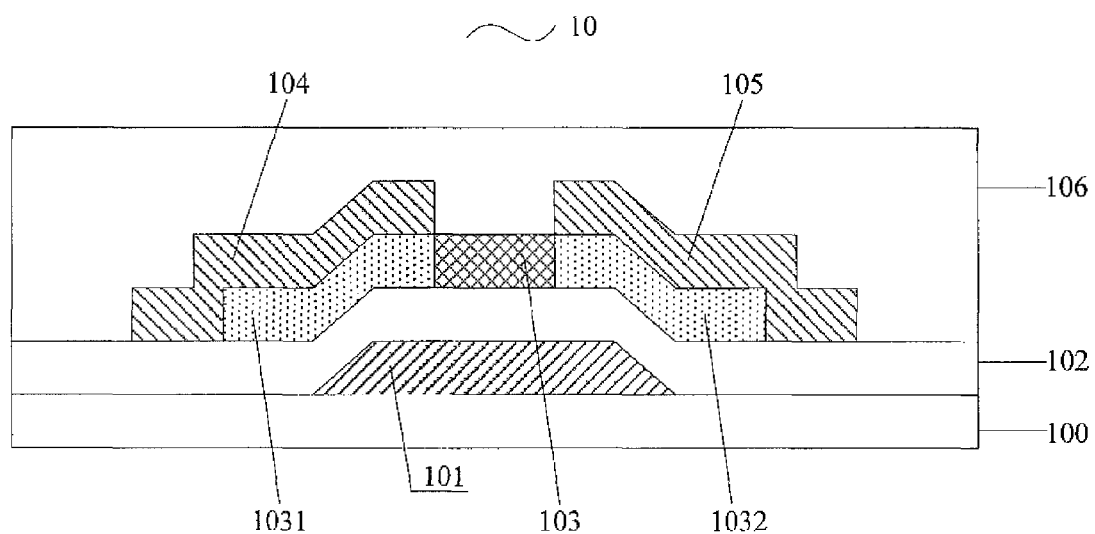
FIG. 1(a) is a first schematic structural view of a thin film transistor according to an embodiment of the present disclosure.
FIG. 1(b) is a first schematic diagram of performing ion implantation according to an embodiment of the present disclosure.
Figure 1:
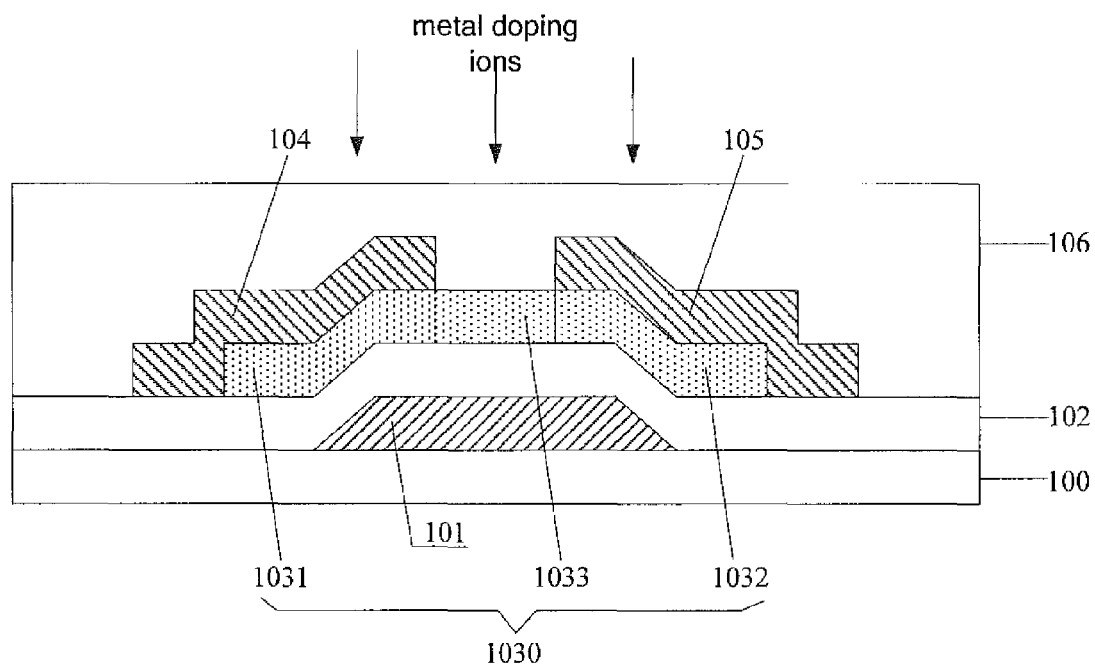

The technical solutions of the embodiments of the present disclosure will be described in a clearly and fully understandable way in connection with the drawings related to embodiments of the disclosure. Apparently, the described embodiments are just a part but not all of the embodiments of the disclosure. Based on the described embodiments herein, those skilled in the art can obtain other embodiment(s), without any inventive work, which shall fall within the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Referring to FIG. 1(a), the embodiment of the present disclosure provides a method of manufacturing a thin film transistor 10, the manufacturing method includes forming a gate electrode 101, a gate insulating layer 102, a metal oxide semiconductor (MOS) active layer 103, a source electrode 104 and a drain electrode 105 on a substrate 100.

Referring to FIG. 1(b), forming the MOS active layer 103 on the substrate 100 includes forming a pattern layer 1030 of indium oxide series binary metal oxide on the substrate, wherein the pattern layer includes a first pattern 1031 corresponding to the source electrode 104, a second pattern 1032 corresponding to the drain electrode 105 and a third pattern 1033 corresponding to a gap between the source electrode 104 and the drain electrode 105, and the pattern layer 1030 of indium oxide series binary metal oxide directly contacts with the source electrode 104 and the drain electrode 105. An insulating layer formed over the source electrode 104 and the drain electrode 105 acts as a protection layer 106, the pattern layer 1030 of indium oxide series binary metal oxide is implanted with metal doping ions by using an ion implanting process and is annealed, so that the indium oxide series binary metal oxide of the third pattern 1033 is converted into the indium oxide series multiple MOS to form the MOS active layer 103.

It is noted that the indium oxide series binary metal oxide refers to a binary metal oxide formed by doping other metal elements into an indium oxide matrix. Herein, the indium oxide series binary metal oxide is a conductive material.

The pattern layer 1030 of indium oxide series binary metal oxide includes the first pattern 1031, the second pattern 1032 and the third pattern 1033, wherein the above three patterns are classified from a perspective of structure, and has nothing to do with the composition material. After performing the ion implanting process, the material of the third pattern 1033 is converted from the indium oxide series binary metal oxide to the indium oxide series multiple MOS. But the thin film transistor 10 is kept in an original pattern shape and located at an original position.

The pattern layer 1030 of indium oxide series binary metal oxide directly contacts with the source electrode 104 and the drain electrode 105, that is, the first pattern 1031 and the second pattern 1032 of the pattern layer 1030 of indium oxide series binary metal oxide directly contact with the source electrode 104 and the drain electrode 105, respectively, and the third pattern 1033 is exposed to the gap between the source electrode 104 and the drain electrode 105.

An insulating layer formed over the source electrode 104 and the drain electrode 105 acts as a barrier layer, it means that the source electrode 104 and the drain electrode 105 are formed firstly, then the protection layer 106 is formed during the thin film transistor 10 is manufactured.

It is required to use the insulating layer as the protection layer during the implanting ion process, because the metal doping ions to be implanted have high energy. If the ions are directly implanted without providing a barrier layer, it may damage the semiconductor active layer since the ion bombarding energy is large, so as to affect the performance of the thin film transistor 10. Therefore, it needs a medium which plays a blocking role in the procedure of implanting ions. Herein, the barrier layer can be any insulating layer which plays a blocking role.

Based on the type of a thin film transistor, if the thin film transistor includes an insulating layer having blocking function, it can directly use the insulating layer as a barrier layer; if the thin film transistor includes an insulating layer which cannot be used as a barrier layer, it can form another insulating layer having blocking function.

The indium oxide series binary metal oxide of the third pattern 1033 is converted into the indium oxide series multiple metal oxide after an implanting ion process is performed, and it can be annealed as required to uniform the structure of the indium oxide series multiple MOS 103, and to allow carriers of the metal oxide semiconductor (MOS) 103 to be located at effective positions, so as to facilitate the transmission of the carriers.

The ambience of the annealing treatment can include air and oxygen, the temperature of the annealing treatment can be performed in a range of 100-600° C.

A method of forming the MOS active layer 103 by using an ion implanting process can be suitable to any kind of thin film transistor including a bottom gate type and a top gate type transistor, but the present disclosure is not limited thereto. The embodiment of the present disclosure provides a method of manufacturing a thin film transistor 10, the manufacturing method includes forming a gate electrode 101, a gate insulating layer 102, a metal oxide semiconductor (MOS) active layer 103, a source electrode 104 and a drain electrode 105 on a substrate 100. Forming the MOS active layer 103 on the substrate 100 includes forming a pattern layer 1030 of indium oxide series binary metal oxide on the substrate. The pattern layer 1030 includes a first pattern 1031 corresponding to the source electrode 104, a second pattern 1032 corresponding to the drain electrode 105 and a third pattern 1033 corresponding to a gap between the source electrode 104 and the drain electrode 105, and the pattern layer 1030 of indium oxide series binary metal oxide directly contacts with the source electrode 104 and the drain electrode 105. An insulating layer formed over the source electrode 104 and the drain electrode 105 acts as a protection layer 106, the pattern layer 1030 of indium oxide series binary metal oxide is implanted with metal doping ions by using an ion implanting process and is annealed; and the indium oxide series binary metal oxide of the third pattern 1033 is converted into the indium oxide series multiple MOS to form the MOS active layer 103.

In the embodiment of the present disclosure, on one hand, since the indium oxide series binary metal oxide is conductive material, the indium oxide series binary metal oxide of the third pattern 1033 is converted into the indium oxide series multiple MOS after being implanted ion and annealed, it corresponds that a transition region from conductor to semiconductor is formed under the source electrode 104 and the drain electrode 105; that is, a transition layer which allows the transmission of the carriers is formed under the source electrode 104 and the drain electrode 105. Therefore, it effectively solves a problem of contact resistance between the MOS active layer 103 and the source electrode 104 and the drain electrode 105. On the other hand, an insulating layer is formed over the source electrode 104 and the drain electrode 105, and the insulating layer acts as a protection layer; when the MOS active layer 103 is formed by using an ion implanting process, it may avoid the MOS active layer 103 being affected by subsequent processes in the procedure of manufacturing the thin film transistor 10. The embodiment of the present disclosure omits a separate process of etching the barrier layer, so that the number of pattern processes is reduced and cost is reduced.

Alternatively, as shown in FIGS. 1(a) and 1(b), the method includes sequentially forming a gate electrode 101, a gate insulating layer 102, a pattern layer 1030 of indium oxide series binary metal oxide, a source electrode 104 and a drain electrode 105, and a protection layer 106 located over the source electrode 104 and the drain electrode 105 on the substrate.

The pattern layer 1030 of indium oxide series binary metal oxide includes the first pattern 1031 corresponding to the source electrode 104 and directly contacting with the source electrode 104, the second pattern 1032 corresponding to the drain electrode 105 and directly contacting with the drain electrode 105 and the third pattern 1033 corresponding to the gap between the source electrode 104 and the drain electrode 105.

In this case, during the MOS active layer 103 is formed, referring to FIG. 1(b), the protection layer 106 can be used as a barrier layer, the pattern layer 1030 of indium oxide series binary metal oxide is implanted with metal ions by using an ion implanting process, then it is annealed at appropriate temperature in air ambience, the indium oxide series binary metal oxide of the third pattern 1033 which is not blocked by the source electrode 104 and the drain electrode 105 is converted into the indium oxide series multiple MOS to form the MOS active layer 103, so as to obtain a bottom gate type of thin film transistor as shown in FIG. 1(a).

Herein, the amount and bombarding energy of implanted metal doping ions are strictly controlled. The amount of the implanted metal doping ions should enable the binary metal oxide to form a multiple MOS having semiconductor properties. The bombarding energy should enable most of metal doping ions to be implanted into the third pattern 1033 of the pattern layer 1030 of indium oxide series binary metal oxide, so as to combine with the indium oxide series binary metal oxide to form the indium oxide series multiple MOS. Therefore, the high energy and deep ion implantation can be used according to an actual situation during the procedure of implanting ions.

Since the metal doping ions have high bombarding energy in the procedure of implanting ions, most of metal doping ions can directly penetrate the protection layer 106 and enter the third pattern 1033 which is not blocked by the source electrode 104 and the drain electrode 105. Since the source electrode 104 and the drain electrode 105 have already been formed over the pattern layer 1030 of indium oxide series binary metal oxide, the metal doping ions that penetrate the protection layer 106 are blocked by the source electrode 104 and the drain electrode 105, so that the metal doping ions cannot be implanted into the first pattern 1031 corresponding to the source electrode 104 and the second pattern 1032 corresponding to the drain electrode 105, and can only be implanted into the third pattern 1033 which is blocked by the source electrode 104 and the drain electrode 105; therefore, only the indium oxide series binary metal oxide of the third pattern 1033 is converted into the indium oxide series multiple metal oxide to form the MOS active layer 103.

As can be seen from above description, after implanting ions and annealing treatment, the material of the third pattern 1033 is the indium oxide series multiple MOS material, the material of the first pattern 1031 and the second pattern 1032 is the indium oxide series binary metal oxide conductive material. The first pattern 1031 directly contacts with the source electrode 104, and the second pattern 1032 directly contacts with the drain electrode 105.

Alternatively, as shown in FIGS. 2(a) and 2(b), the method further includes sequentially forming the pattern layer 1030 of indium oxide series binary metal oxide, the source electrode 104 and the drain electrode 105, the gate insulating layer 102 and the gate electrode 101 on the substrate 100.

The pattern layer 1030 of indium oxide series binary metal oxide includes the first pattern 1031 corresponding to the source electrode 104 and directly contacting with the source electrode 104, the second pattern 1032 corresponding to the drain electrode 105 and directly contacting with the drain electrode 105 and the third pattern 1033 corresponding to the gap between the source electrode 104 and the drain electrode 105.

In this case, during the MOS active layer 103 is formed, referring to FIG. 2(b), an insulating layer 102 can be used as the barrier layer after the insulating layer 102 is formed, the pattern layer 1030 of indium oxide series binary metal oxide is implanted with metal ions by using an ion implanting process, then it is annealed at appropriate temperature in air ambience, the indium oxide series binary metal oxide of the third pattern 1033 which is not blocked by the source electrode 104 and the drain electrode 105 is converted into the indium oxide series multiple MOS to form the MOS active layer 103, and then to form the gate electrode 101 over the gate insulating layer 102 to obtain a top gate type of thin film transistor as shown in FIG. 2(a).

Herein, the source electrode 104 and the drain electrode 105 are located over the pattern layer 1030 of indium oxide series binary metal oxide; during the metal doping ions are implanted into the pattern layer 1030 of indium oxide series binary metal oxide by using an ion implanting process, the metal doping ions that penetrate the gate insulating layer 102 are blocked by the source electrode 104 and the drain electrode 105 so that the metal doping ions cannot be implanted into the first pattern 1031 corresponding to the source electrode 104 and the second pattern 1032 corresponding to the drain electrode 105, and can only be implanted into the third pattern 1033 which is not blocked by the source electrode 104 and the drain electrode 105; then the annealing treatment is performed, only the indium oxide series binary metal oxide of the third pattern 1033 is converted into the indium oxide series multiple metal oxide to form the MOS active layer 103.

As can be seen from above description, after implanting ions and annealing treatment, the material of the third pattern 1033 is the indium oxide series multiple MOS material, the material of the first pattern 1031 and the second pattern 1032 is the indium oxide series binary metal oxide conductive material. The first pattern 1031 directly contacts with the source electrode 104, the second pattern 1032 directly contacts with the drain electrode 105.

The indium oxide series binary metal oxide includes ITO, or IGO, or IZO; the metal doping ions include at least one kind of $Zn^{2+}$, $Ga^{3+}$, $Sn^{2+}$, $Al^{3+}$ and $Hf^{4+}$.

It is noted that since the indium oxide series binary metal oxide will form the indium oxide series multiple metal oxide after the indium oxide series binary metal oxide is implanted ions, the metal doping ions to be implanted and the indium oxide series binary metal oxide that is to be implanted ions must include different elements. For example, $Sn^{2+}$ is not to be implanted when the ITO is implanted metal doping ions.

Currently, for the indium oxide series binary metal oxide, ITO, IGO, and IZO have been widely studied; the indium oxide series binary metal oxide is implanted with at least one kind of $Zn^{2+}$, $Ga^{3+}$, $Sn^{2+}$, $Al^{3+}$ and $Hf^{4+}$ by using an ion implanting process, thereby to form, for example, a semiconductor material with stable characteristics, such as indium tin zinc oxide (ITZO), indium gallium tin oxide (IGTO), indium gallium zinc oxide (IGZO), hafnium indium zinc oxide (HIZO), aluminum tin zinc indium oxide (ATZIO) or the like.

Two examples will be provided hereinafter to describe the method of manufacturing the thin film transistor of the present disclosure in detail.

Figure 3:
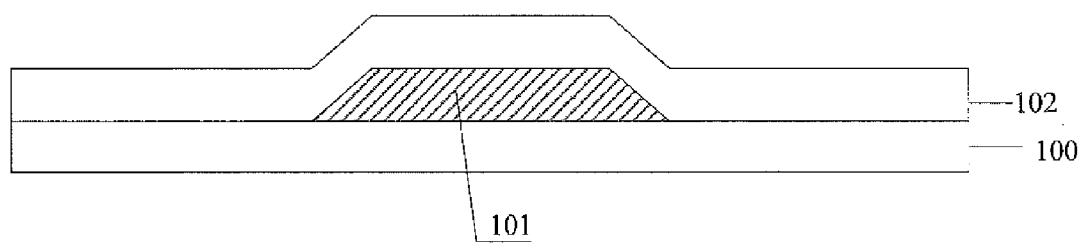
FIGS. 3-5 are first schematic procedure diagrams of forming a thin film transistor according to embodiments of the present disclosure.

When the thin film transistor 10 is a bottom gate type of transistor, the indium oxide series binary metal oxide is ITO, the metal doping ions are $Zn^{2+}$ ions, the method includes the following steps:

S101, as shown in FIG. 3, a pattern including the gate electrode 101 is formed on the substrate 100 by one pattern process; and the gate insulating layer 102 is formed on the substrate on which the gate electrode 101 is formed.

During the gate electrode 101 is formed, a gate line and a lead of the gate line are formed, a common electrode line can also be formed.

Herein, a conductive thin film can be deposited on the substrate 100 by a magnetron sputtering method, wherein the conductive thin film has a thickness of 1-1000 nm. The conductive thin film is typically made of chrome, titanium, molybdenum, tungsten, aluminum, copper, nickel alloy, molybdenum tungsten alloy, tungsten copper alloy and the like, or the other composite conductive materials. A mask is used to perform a pattern process, such as exposure, developing, etching, removing and the like, so as to form a pattern, such as the gate electrode 101, the gate line (not shown in Figures), a lead of the gate line and the like. Then, an insulating film is deposited on the substrate 100, on which the pattern of the gate electrode 101 is formed, by a chemical vapor deposition process, wherein the insulating film has a thickness of 10-5000 nm. The insulating film is typically made of silicon nitride, and the insulating film can also be made of one or more of silicon oxide, silicon oxynitride and aluminum oxide and the like.

Figure 4:
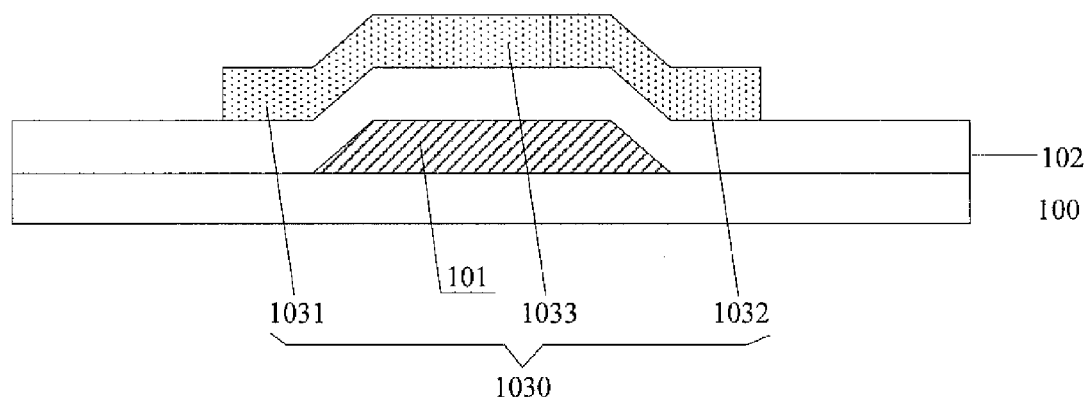

S102, as shown in FIG. 4, the ITO binary metal oxide film is formed on the substrate 100 undergone the step S101, and the pattern layer 1030 of the ITO binary metal oxide is formed by one pattern process.

The pattern layer 1030 of the ITO binary metal oxide includes the first pattern 1031 corresponding to the source electrode 104 to be formed, the second pattern 1032 corresponding to the drain electrode 105 to be formed and third pattern 1033 corresponding to the gap between the source electrode 104 and the drain electrode 105 to be formed.

Herein, a ITO metal oxide thin film can be deposited on the substrate 100, on which the gate insulating layer 102 is formed, by a physical vapor deposition process, wherein the ITO metal oxide thin film has a thickness of 50-2000 nm; then a mask is used to perform a pattern process, such as exposure, developing, etching, removing and the like, so as to form the pattern layer 1030 of the ITO binary metal oxide.

It is noted that the etching is performed to the source-drain metal layer in a subsequent manufacturing process; the ITO is not etched by selecting appropriate metal etching liquid, thereby the ITO is not affected by the metal etching liquid. Therefore, the present disclosure does not need to make an etching barrier layer, the metal etching can be directly performed. With respect to a conventional technology, such manner can reduce one pattern process, thereby improve production efficiency and reduce the cost.

Figure 5:
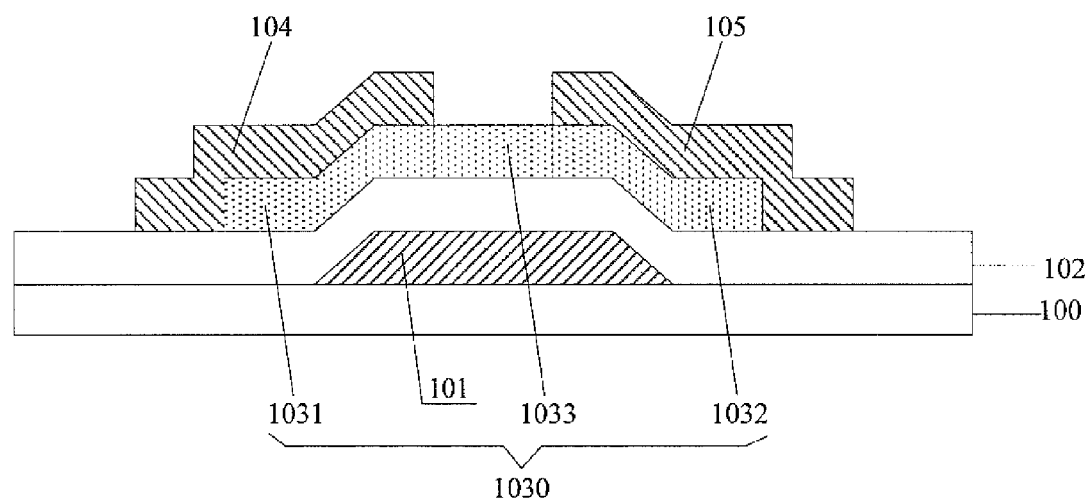

S103, as shown in FIG. 5, the source-drain metal thin film is formed on the substrate 100 undergone the step S102, and the source electrode 104 and the drain electrode 105 are formed by one pattern process.

The first pattern 1031 and the second pattern 1032 of the pattern layer 1030 of the ITO binary metal oxide correspond to and directly contact with the source electrode 104 and the drain electrode 105, respectively.

Herein, a conductive thin film can be deposited on the substrate 100, on which the pattern layer 1030 of the ITO binary metal oxide is formed, by a magnetron sputtering method, wherein the conductive thin film has a thickness of 1-1000 nm. The conductive thin film is typically made of a metal, such as chrome, titanium, molybdenum, tungsten, aluminum, copper, or an alloy such as aluminum nickel alloy, molybdenum tungsten alloy, tungsten copper alloy or the like, or other composite conductive materials. A mask is used to perform a pattern process, such as exposure, developing, etching, removing and the like, so as to form the first pattern 1031 corresponding to and directly contacting with the source electrode 104 and the second pattern 1032 corresponding to and directly contacting with the drain electrode 105.

While the source electrode 104 and the source electrode 105 are formed, a data line is also formed.

S104, as shown in FIG. 1(*b*), the protection layer 106 is formed on the substrate 100 undergone the step S103.

Herein, a protection thin film is deposited on the substrate 100, on which the source electrode 104 and the source electrode 105 are formed, by chemical vapor deposition. The protection thin film has a thickness of 10-5000 nm. The protection thin film is typically made of silicon nitride, and the protection thin film can also be made of one or more insulating materials, such as silicon oxide, silicon oxynitride and aluminum oxide and the like; then a mask is used to perform a pattern process, such as exposure, developing, etching, removing and the like, so as to form the protection layer 106.

S105, as shown in FIG. 1(*b*), on the substrate 100 undergone the step S104, the protection layer 106 is used as a barrier layer, the pattern layer 1030 of ITO binary metal oxide is implanted with $Zn^{2+}$ ions by using an ion implanting process, then it is annealed at appropriate temperature in air ambience, so that the ITO of the third pattern 1033 is converted into ITZO semiconductor to form the MOS active layer 103, and so as to obtain a thin film transistor structure as shown in FIG. 1(*a*).

According to above steps S101-S105, a thin film transistor 10 of a bottom gate type of structure can be formed. The MOS active layer 103 includes ITZO semiconductor, the source electrode 104 further includes the first pattern 1031, and the drain electrode 105 further includes the second pattern 1032.

When the thin film transistor 10 is a top gate type of transistor, the indium oxide series binary metal oxide is IZO, the metal doping ion is $Ga^{3+}$, the method includes the following steps.

Figure 6:
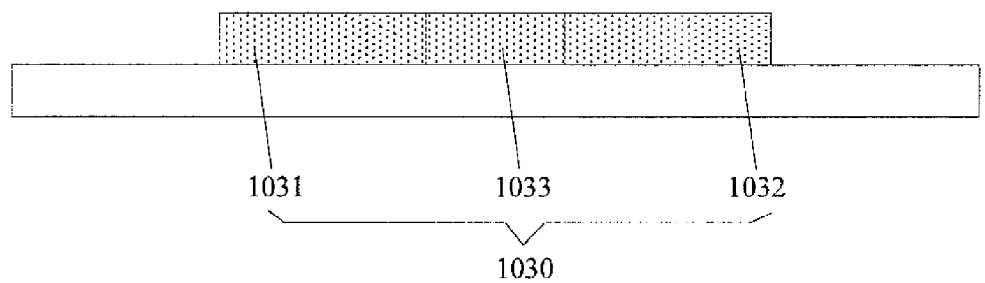
FIGS. 6-8 are second procedure schematic diagrams of forming a thin film transistor according to embodiments of the present disclosure.

S201, as shown in FIG. 6, a IZO binary metal oxide thin film is formed on the substrate 100, and the pattern layer 1030 of the IZO binary metal oxide is formed by one pattern process.

The pattern layer 1030 of the IZO binary metal oxide includes the first pattern 1031 corresponding to the source electrode 104 to be formed, the second pattern 1032 corresponding to the drain electrode 105 to be formed and the third pattern 1033 corresponding to the gap between the source electrode 104 and the drain electrode 105 to be formed.

Herein, a IZO metal oxide thin film can be deposited on the substrate 100 by physical vaporous deposition, wherein the IZO metal oxide thin film has a thickness of 50-2000 nm; then a mask is used to perform a pattern process, such as exposure, developing, etching, removing and the like, so as to form the pattern layer 1030 of the IZO binary metal oxide.

Figure 7:
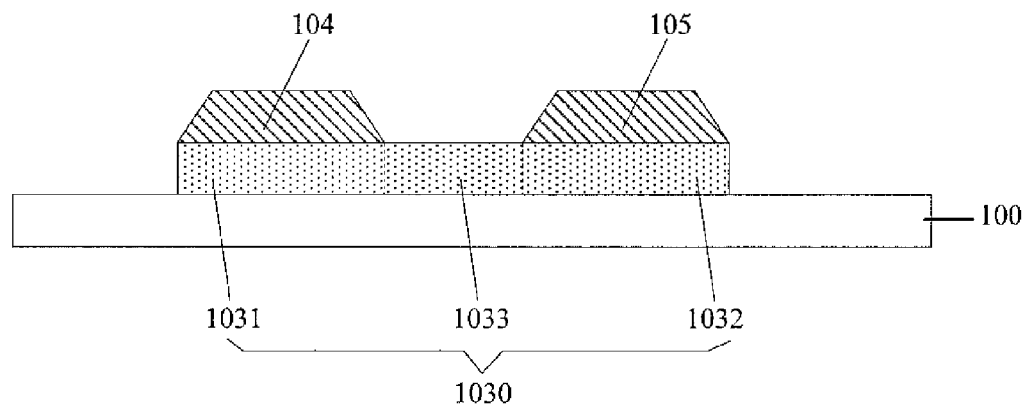

S202, as shown in FIG. 7, the source-drain metal thin film is formed on the substrate 100 undergone the step S201, and the source electrode 104 and the drain electrode 105 are formed by one pattern process.

The first pattern 1031 and the second pattern 1032 of the pattern layer 1030 of the IZO binary metal oxide correspond to and directly contact with the source electrode 104 and the drain electrode 105, respectively.

Herein, a conductive thin film can be deposited on the substrate 100, on which the pattern layer 1030 of the IZO binary metal oxide is formed, by a magnetron sputtering method. The conductive thin film has a thickness of 1-1000 nm. The conductive thin film is typically made of a metal, such as chrome, titanium, molybdenum, tungsten, aluminum, copper, or alloy material, such as aluminum nickel alloy, molybdenum tungsten alloy, tungsten copper alloy or the like, or other composite conductive materials.

Then, a mask is used to perform a pattern process, such as exposure, developing, etching, removing and the like, so as to form the first pattern 1031 corresponding to and directly contacting with the source electrode 104 and the second pattern 1032 corresponding to and directly contacting with the drain electrode 105.

Figure 8:
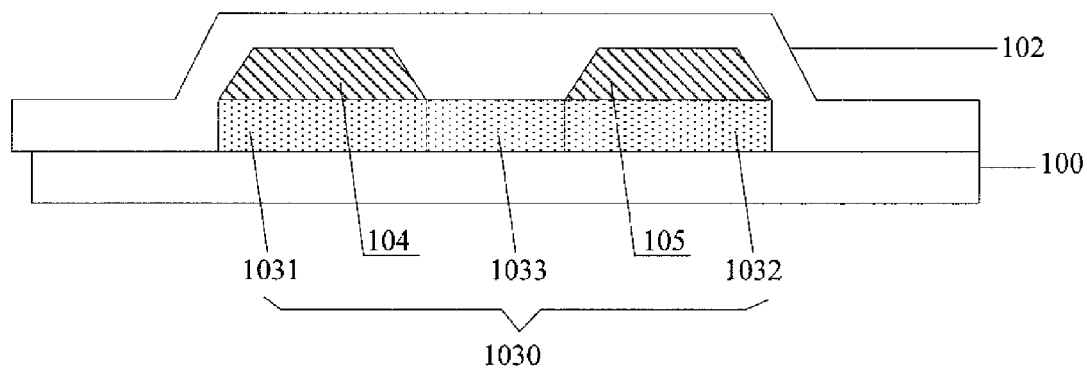

S203, as shown in FIG. 8, a gate insulating layer 102 is formed on the substrate 100 undergone the step S202.

Herein, an insulating thin film may be deposited on the substrate 100, on which the source electrode 104 and the source electrode 105 are formed, by chemical vapor deposition. The insulating thin film has a thickness of 10-5000 nm. The insulating thin film is typically made of silicon nitride, and the insulating thin film can also be made of one or more of insulating materials, such as silicon oxide, silicon oxynitride and aluminum oxide and the like.

Figure 2:
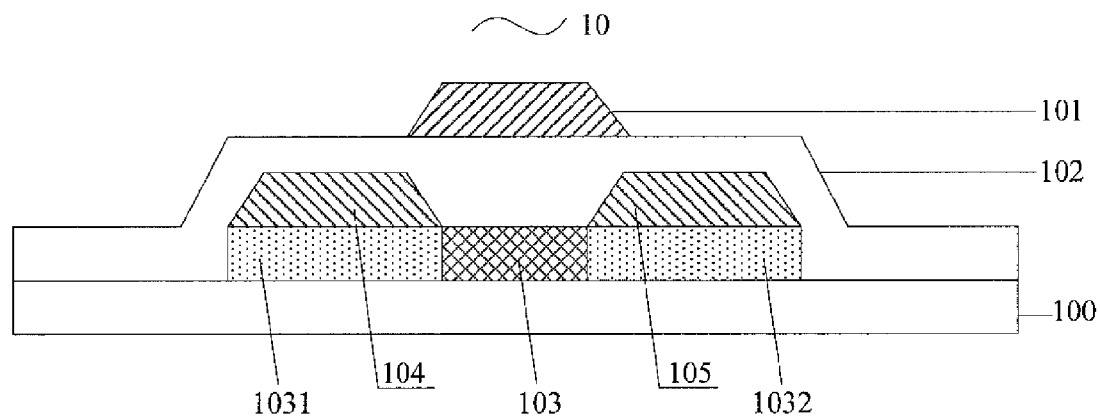
FIG. 2(a) is a second schematic structural view of a thin film transistor according to an embodiment of the present disclosure.
FIG. 2(b) is a second schematic diagram of performing ion implantation according to an embodiment of the present disclosure.
Figure 2:
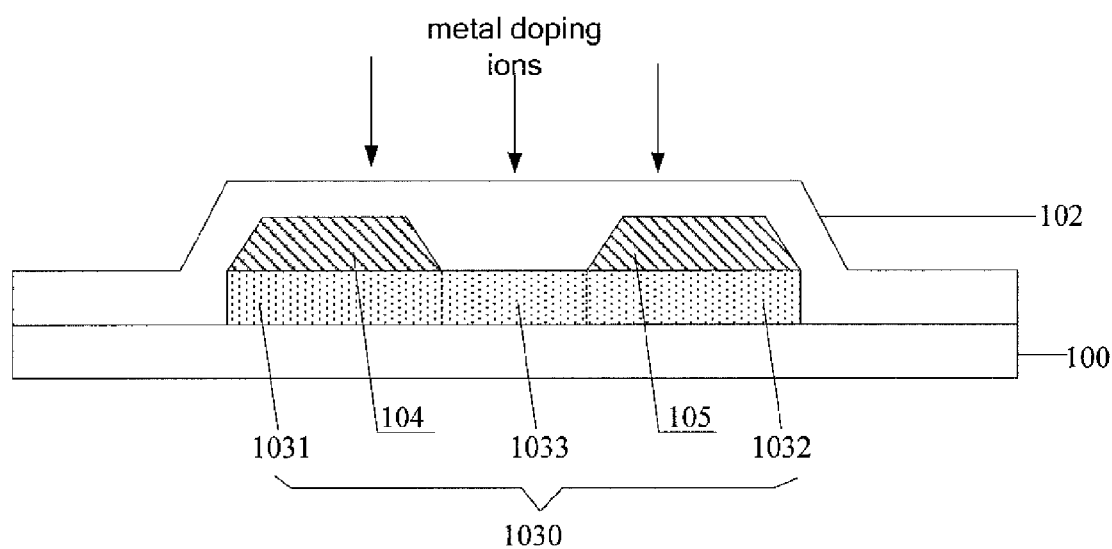

S204, as shown in FIG. 2(*b*), the gate insulating layer 102 is used as a barrier layer, and the pattern layer 1030 of IZO binary metal oxide is implanted with $Ga^{3+}$ by using an ion implanting process, then it is annealed at appropriate temperature in air ambience, so that the IZO of the third pattern 1033 is converted into IGZO semiconductor to form the MOS active layer 103.

S205, as shown in FIG. 2(*a*), a metal thin film is formed on the substrate 100 undergone the step S204, and the gate electrode 101 is formed by one pattern process.

While the gate electrode 101 is formed, a gate line and a lead of the gate line are formed, a common electrode line can also be formed.

Herein, a conductive thin film can be deposited on the substrate 100, on which the gate insulating layer 102 is formed, by a magnetron sputtering method. The conductive thin film has a thickness of 1-1000 nm. The conductive thin film is typically made of a metal, such as chrome, titanium, molybdenum, tungsten, aluminum, copper, or an alloy, such as aluminum nickel alloy, molybdenum tungsten alloy, tungsten copper alloy or the like, or other composite conductive materials. A mask is used to perform a pattern process, such as exposure, developing, etching, removing and the like, so as to form a pattern, such as a pattern of the gate electrode 101, the gate line (not shown in Figures), the lead of the gate line and the like.

According to above steps S201-S205, a thin film transistor 10 of a top gate type of structure can be formed. The MOS active layer 103 includes IGZO semiconductor.

Embodiments of the present disclosure provides a thin film transistor 10 manufactured by using the described method, as shown in FIGS. 1(a) and 2(a), the thin film transistor 10 includes a gate electrode 101, a gate insulating layer 102, a MOS active layer 103, a source electrode 104 and a drain electrode 105 disposed on a substrate 100. The MOS active layer 103 is located between the substrate 100 and the source electrode 104 and the drain electrode 105, and corresponds to the gap between the source electrode 104 and the drain electrode 105. The thin film transistor 10 further includes a first pattern 1031 and a second pattern 1032 which contact with the MOS active layer and are located at a same layer with the MOS active layer 103. The first pattern 1031 corresponds to the source electrode 104 and directly contacts with the source electrode 104, and the second pattern 1032 corresponds to the drain electrode 105 and directly contacts with the drain electrode 105.

The first pattern 1031 and the second pattern 1032 include indium oxide series binary metal oxide. The MOS active layer 103 includes indium oxide series multiple MOS, and the indium oxide series multiple metal oxide is obtained by implanting metal doping ions into the indium oxide series binary metal oxide and annealing it.

It is noted that the thin film transistor can be a top gate type or a bottom gate type of transistor, which is not limited thereto herein. However, regardless what kinds of structure the thin film transistor 10 is, it should allow the first pattern 1031, the second pattern 1032 and the MOS active layer 103 to be located under the source electrode 104 and the drain electrode 105, thereby it can allow only the indium oxide series binary metal oxide corresponding to the gap between the source electrode 104 and the drain electrode 105 to be converted into the indium oxide series multiple MOS during ions implantation.

The bottom gate type of thin film transistor 10 refers to a type of transistors in which the gate electrode 101 is underlying and the source electrode 104 and the drain electrode 105 are superimposed. The top gate type of thin film transistor 10 refers to a type of transistors in which the gate electrode 101 is superimposed and the source electrode 104 and the drain electrode 105 are underlying.

Since the first pattern 1031 directly contacts with the source electrode 104 and the second pattern 1032 directly contacts with the drain electrode 105, and both of the first pattern 1031 and the second pattern 1032 include the indium oxide series binary metal oxide conductive material, a transition region from conductor to semiconductor is formed under the source electrode 104 and the drain electrode 105, so that a transition layer which supports the carriers transmission is provided. Therefore, it effectively solves a problem of contact resistance between the MOS active layer 103 and the source electrode 104 and the drain electrode 105.

Alternatively, as shown in FIG. 1(a), when the thin film transistor 10 is a bottom gate type of transistor, the thin film transistor 10 can include a gate electrode 101 disposed on the substrate 100, a gate insulating layer 102 disposed over the gate electrode 101, a MOS active layer 103 disposed over the gate insulating layer 102, a first pattern 1031 and a second pattern 1032 which contact with the MOS active layer 103 and are located at a same layer with the MOS active layer 103, a source electrode 104 and a drain electrode 105 disposed respectively over the first pattern 1031 and the second pattern 1032, and a protection layer 106 disposed over the source electrode 104 and the drain electrode 105. The MOS active layer 103 corresponds to a gap between the source electrode 104 and the drain electrode 105.

The first pattern 1031 and the second pattern 1032 include indium oxide series binary metal oxide. The MOS active layer 103 includes indium oxide series multiple MOS, and the indium oxide series multiple metal oxide is obtained by implanting metal doping ions into the indium oxide series binary metal oxide and annealing it.

Herein, the indium oxide series binary metal oxide is a conductive material; the first pattern 1031 corresponds to and directly contacts with the source electrode 104, the second pattern 1032 corresponds to and directly contacts with the drain electrode 105.

Furthermore, the MOS active layer 103 is formed by an ion implanting process after the source electrode 104 and the drain electrode 105 are formed; however, before implanting ions, it requires to etch the source-drain metal layer to form the source electrode 104 and the drain electrode 105. On this basis, it is possible to prevent a metal etching liquid affecting the indium oxide series binary metal oxide corresponding to the gap between the source electrode 104 and the drain electrode 105 by selecting an appropriate metal etching liquid. Therefore, the present disclosure does not need to form an etching barrier layer, and the metal etching can be directly performed. Comparing with a conventional technique, such manner can save one pattern process, so as to improve production efficiency and reduce the cost.

Alternatively, as shown in FIG. 2(a), when the thin film transistor 10 is a top gate type of transistor, the thin film transistor 10 can include a MOS active layer 103 disposed on the substrate 100, a first pattern 1031 and a second pattern 1032 which contact with the MOS active layer 103 and are located at a same layer with the MOS active layer 103, a source electrode 104 and a drain electrode 105 disposed respectively over the first pattern 1031 and the second pattern 1032, a gate insulating layer 102 disposed over the source electrode 104 and the drain electrode 105, and a gate electrode 101 disposed over the gate insulating layer 102. The MOS active layer 103 corresponds to a gap between the source electrode 104 and the drain electrode 105.

Alternatively, the indium oxide series binary metal oxide includes ITO, or IGO, or IZO; the metal doping ions include at least one kind of $Zn^{2+}$, $Ga^{3+}$, $Sn^{2+}$, $Al^{3+}$ and $Hf^{4+}$.

It is noted that since the indium oxide series binary metal oxide will form the indium oxide series multiple metal oxide after the indium oxide series binary metal oxide is implanted ions; the metal doping ions to be implanted and the indium oxide series binary metal oxide that will be implanted ions must include different elements. For example, $Sn^{2+}$ will not be implanted when the ITO is implanted metal doping ions.

On this basis, the indium oxide series binary metal oxide can be properly combined with the metal doping ions so that the performance of the obtained indium oxide series multiple metal oxide optimally matches the application of the thin film transistor 10.

The embodiments of the present disclosure provide a thin film transistor 10. The thin film transistor 10 includes a gate electrode 101, a gate insulating layer 102, a MOS active layer 103, a source electrode 104 and a drain electrode 105 disposed on a substrate 100. The MOS active layer 103 is located between the substrate 100 and the source electrode 104 and the drain electrode 105, and corresponds to the gap between the source electrode 104 and the drain electrode 105. The thin film transistor 10 further includes a first pattern 1031 and a second pattern 1032 which contact with the MOS active layer 103 and are located at a same layer with the MOS active layer 103, and the first pattern 1031 corresponds to the source electrode 104 and directly contacts with the source electrode 104, the second pattern 1032 corresponds to the drain electrode 105 and directly contacts with the drain electrode 105. The first pattern 1031 and the second pattern 1032 include indium oxide series binary metal oxide.

The MOS active layer 103 includes indium oxide series multiple MOS, and the indium oxide series multiple metal oxide is obtained by implanting metal doping ions into the indium oxide series binary metal oxide and annealing it.

For the thin film transistor 10 provided by the embodiments of the present disclosure, the first pattern 1031 and the second pattern 1032 which contact with the MOS active layer 103 and are located at a same layer with the MOS active layer 103, and the MOS active layer 103 corresponds to a gap between the source electrode 104 and the drain electrode 105. Since the first pattern 1031 corresponds to and contacts with the source electrode 104 and the second pattern 1032 corresponds to and contacts with the drain electrode 105, and both of the first pattern 1031 and the second pattern 1032 include the indium oxide series binary metal oxide conductive material, therefore, a transition region from conductor to semiconductor is formed under the source electrode 104 and the drain electrode 105, so that a transition layer which supports the carriers transmission is formed. Therefore, it effectively solves a problem of contact resistance between the MOS active layer 103 and the source electrode 104 and the drain electrode 105.

The embodiment of the present disclosure provides an array substrate including the described thin film transistor 10.

Figure 9:
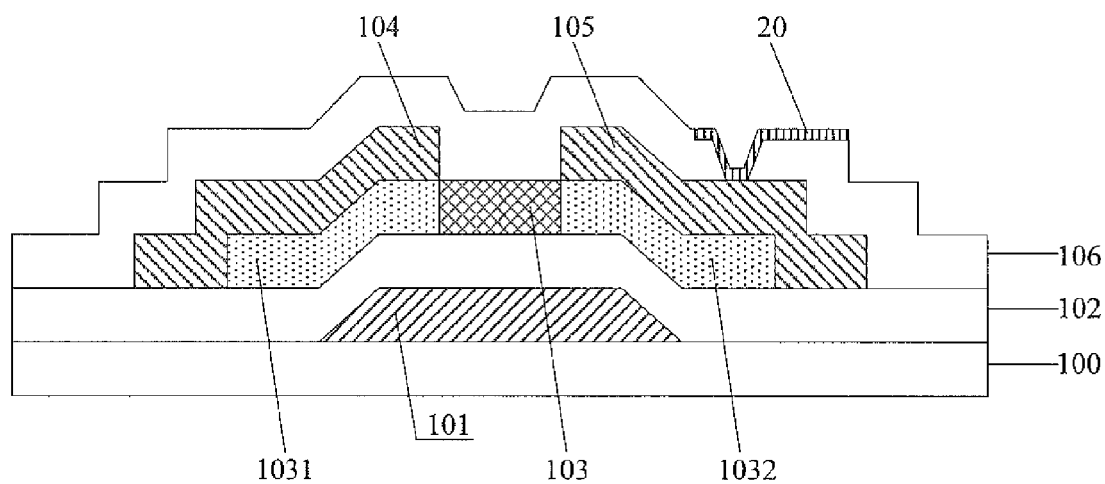
FIG. 9 is a schematic structural view of an array substrate according to an embodiment of the present disclosure.

Herein, when the array substrate is applied to a liquid crystal display device, as shown in FIG. 9, the array substrate further includes a pixel electrode 20 electrically connected to the drain electrode 105 of the thin film transistor 10.

A common electrode can also be formed.

Furthermore, when the array substrate is applied to an organic electroluminescent device, the array substrate further includes a cathode and an anode. A planarization layer and a pixel defining layer can be formed as required.

The pixel defining layer is used to ensure the droplets of luminescent material neatly overspreading the pixel region and avoid the droplets flowing to adjacent pixel regions when a luminous layer is formed by a printing technique.

The embodiment of the present disclosure further provides a display device including the described array substrate.

The display device can be a product or component with displaying function, such as a liquid crystal panel, OLED, an electric paper, a liquid crystal television, a liquid crystal display, a digital photo frame, a mobile phone, or a tablet computer.

The embodiment of the present disclosure provides a thin film transistor and a manufacturing method thereof, an array substrate and a display device. The manufacturing method includes forming a gate electrode, a gate insulating layer, a MOS active layer, a source electrode and a drain electrode on a substrate. The method further includes forming a pattern layer of indium oxide series binary metal oxide on the substrate. The pattern layer includes a first pattern corresponding to the source electrode, a second pattern corresponding to the drain electrode and a third pattern corresponding to a gap between the source electrode and the drain electrode, and the pattern layer of indium oxide series binary metal oxide directly contacts with the source electrode and the drain electrode. An insulating layer formed over the source electrode and the drain electrode acts as a barrier layer, the pattern layer of indium oxide series binary metal oxide is implanted with metal doping ions by using an ion implanting process, and is annealed, so that the indium oxide series binary metal oxide of the third pattern is converted into the indium oxide series multiple metal oxide to form the MOS active layer.

In embodiments of the present disclosure, on one hand, since the indium oxide series binary metal oxide is conductive material, when the indium oxide series binary metal oxide of the third pattern is converted into the indium oxide series multiple MOS after it is implanted ions and annealed, a transition region from conductor to semiconductor is formed under the source electrode and the drain electrode, so that a transition layer which supports the carriers transmission is formed under the source electrode and the drain electrode. Therefore, it effectively solves a problem of contact resistance between the MOS active layer and the source electrode and the drain electrode. On the other hand, an insulating layer is formed over the source electrode and the drain electrode, and the insulating layer acts as a protection layer. When the MOS active layer is formed by using an ion implanting process, it may avoid the MOS active layer being affected by subsequent processes during the thin film transistor is manufactured. The embodiments of the present disclosure omit a separate process of etching the barrier layer, so that the number of pattern processes is decreased and the cost is reduced It is understood that the described above are only illustrative embodiments and implementations for explaining the present disclosure, and the present disclosure is not intended to be limited thereto. For one of ordinary skill in the art, various modifications and improvements may be made without departing from the spirit and scope of embodiments of the present disclosure, and all of which and their equivalents should fall within the protection scope of the present disclosure. The scope protected by the present disclosure is defined by the appended claims.

The present disclosure claims priority of Chinese patent application No. 201310719312.3 filed on Dec. 24, 2013 titled "a thin film transistor and manufacturing method thereof, an array substrate and a display device", the entire contents of which are incorporated herein by reference.

What is claimed is:

1. A method of manufacturing a thin film transistor, comprising:
    forming a gate electrode, a gate insulating layer, a metal oxide semiconductor (MOS) active layer, a source electrode and a drain electrode on a substrate;
    forming a pattern layer of indium oxide series binary metal oxide, wherein the pattern layer comprises a first pattern corresponding to the source electrode, a second pattern corresponding to the drain electrode and a third pattern corresponding to a gap between the source electrode and the drain electrode, and the pattern layer of indium oxide series binary metal oxide directly contacts the source electrode and the drain electrode;
    forming an insulating layer over the source electrode and the drain electrode; and
    using the insulating layer formed over the source electrode and the drain electrode as a protection layer, implanting metal doping ions into the pattern layer of indium oxide series binary metal oxide by using an ion implanting process, and annealing it, so that the indium oxide series binary metal oxide of the third pattern is converted into indium oxide series multiple metal oxide to form the MOS active layer.

2. The manufacturing method according to claim 1, wherein the thin film transistor is a bottom gate type of transistor.

3. The manufacturing method according to claim 1, further comprising:

using the protection layer as a barrier layer, implanting metal doping ions into the pattern layer of indium oxide series binary metal oxide by using an ion implanting process, and annealing it, so that the indium oxide series binary metal oxide of the third pattern which is not blocked by the source electrode and the drain electrode is converted into the indium oxide series multiple metal oxide to form the MOS active layer.

4. The manufacturing method according to claim 1, wherein the thin film transistor is a top gate type of transistor.

5. The manufacturing method according to claim 4, further comprising:

using the gate insulating layer as a barrier layer, implanting metal doping ions into the pattern layer of indium oxide series binary metal oxide by using an ion implanting process, and annealing it, so that the indium oxide series binary metal oxide of the third pattern which is not blocked by the source electrode and the drain electrode is converted into the indium oxide series multiple metal oxide to form the MOS active layer.

6. The manufacturing method according to claim 1, wherein the indium oxide series binary metal oxide comprises indium tin oxide (ITO), or indium gallium oxide (IGO), or indium zinc oxide (IZO).

7. The manufacturing method according to claim 1, wherein the metal doping ions comprise at least one kind of zinc ions (Zn2+), gallium ions (Ga3+), tin ions (Sn2+), aluminium ions (Al3+) and hafnium ions (Hf4+).

\* \* \* \* \*